US 8,710,748 B2

(12) United States Patent
Iketsu et al.

(10) Patent No.: US 8,710,748 B2
(45) Date of Patent: Apr. 29, 2014

(54) ILLUMINATION APPARATUS

(75) Inventors: Yuichi Iketsu, Tokyo (JP); Tsukasa Yagi, Tokyo (JP); Kouichi Ishida, Osaka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 197 days.

(21) Appl. No.: 13/514,316

(22) PCT Filed: Nov. 22, 2010

(86) PCT No.: PCT/JP2010/070784
§ 371 (c)(1),
(2), (4) Date: Jun. 7, 2012

(87) PCT Pub. No.: WO2011/070907
PCT Pub. Date: Jun. 16, 2011

(65) Prior Publication Data
US 2012/0242233 A1 Sep. 27, 2012

(30) Foreign Application Priority Data
Dec. 11, 2009 (JP) .................................. 2009-281508

(51) Int. Cl.
H05B 37/00 (2006.01)
H05B 41/16 (2006.01)
H05B 37/02 (2006.01)

(52) U.S. Cl.
USPC ............ 315/161; 315/312; 315/224; 315/291

(58) Field of Classification Search
CPC ....................................................... H05B 37/00
USPC .................. 315/294, 224, 122, 185, 291, 161
See application file for complete search history.

(56) References Cited

U.S. PATENT DOCUMENTS

| 2006/0208669 A1* | 9/2006 | Huynh et al. ................. 315/312 |
| 2010/0091807 A1* | 4/2010 | Deppe et al. ............... 372/38.04 |
| 2010/0134018 A1* | 6/2010 | Tziony et al. ................. 315/122 |
| 2011/0089862 A1* | 4/2011 | Jacobs et al. ................. 315/294 |

FOREIGN PATENT DOCUMENTS

| JP | 11-329721 | 11/1999 |
| JP | 2004-134385 | 4/2004 |
| JP | 2004-234868 | 8/2004 |
| JP | 2005-149744 | 6/2005 |
| JP | 2007-251036 | 9/2007 |
| JP | 2009/054290 | 4/2009 |

* cited by examiner

Primary Examiner — Douglas W Owens
Assistant Examiner — Wei Chan
(74) Attorney, Agent, or Firm — Lucas & Mercanti, LLP

(57) ABSTRACT

Disclosed is an illumination apparatus, which is constituted by a plurality of OLED devices and makes it possible to improve an accuracy of a dimming control operation. The apparatus is provided with a driving electric power source including: a pulse generating section; an OLED driving section; a first voltage source; a second voltage source; a current source; a switchover section that conducts a switchover operation between the first voltage source and the current source during the time when the duty ratio of the driving pulses is increasing, and also conducts another switchover operation between the first voltage source and the current source during the time when the duty ratio of the driving pulses is decreasing; and an OLED illumination disabling section that makes the second voltage source supply the second electric power to the OLED unit, only during the time when each of the pulses is the OFF state.

5 Claims, 10 Drawing Sheets

ILLUMINATION APPARATUS

CROSS REFERENCE TO RELATED APPLICATION

This Application is a 371 of PCT/JP2010/070784 filed on Nov. 22, 2010 which, in turn, claimed the priority of Japanese Patent Application No. 2009-281508 filed on Dec. 11, 2009, both applications are incorporated by reference herein.

FIELD OF THE INVENTION

The present invention relates to an illumination apparatus, and specifically relates to an illumination apparatus in which a plurality of OLEDs (Organic Light Emitting Diodes) is arranged.

BACKGROUND OF THE INVENTION

The present invention relates to an illumination apparatus, and specifically relates to an illumination apparatus in which a plurality of OLEDs (Organic Light Emitting Diodes) is arranged.

When a plurality of singular OLED devices are made to be arrayed in a coupling pattern, the OLED devices are generally coupled to each other in a serial connection mode, instead of a parallel connection mode, in order to avoid such troubles that, when plural OLED devices are coupled to each other in the parallel connection mode, the electric currents respective flowing into the plural OLED devices are not the same and this causes variations between the luminance levels of the plural OLED devices, and if one of them generates a malfunction of the short circuit, all of the OLED devices becomes incapable of emitting light, etc.

Further, conventionally well-known is such an illumination apparatus that employs the plurality of singular OLED devices, which are coupled to each other in the serial connection mode, as the light source, and that makes them emit light by supplying the electric current acquired by applying the half-wave rectifying operation to the alternate electric current (hereinafter, also referred to as AC, for simplicity) fed from the commercial power source (for instance, refer to Tokkai 2004-234868 (Japanese Patent Application Laid-Open Publication)).

Still further, conventionally well-known is such another illumination apparatus that includes a plurality of OLED units, each of which is configured by coupling the singular OLED devices to each other in the serial connection mode, so as to make it possible to vary the brightness thereof by employing the AC for driving the OLED units coupled to the commercial power source, and by increasing and decreasing the number of OLED units that are currently turned ON, while making each of the OLED units turn ON or OFF as needed (for instance, refer to Tokkai 2004-134385 (Japanese Patent Application Laid-Open Publication)).

Yet further, conventionally well-known is such still another illumination apparatus that makes it possible to increase and decrease the brightness of the light source constituted by a single OLED, by employing controlling method for changing a value of direct electric current (hereinafter, also referred to as DC, for simplicity) voltage at the time of the high luminance mode, while employing the PWM (Pulse Width Modulation controlling method for modulating the DC voltage into the width-modulated pulses at the time of the low luminance mode (for instance, refer to Tokkai 2007-251036 (Japanese Patent Application Laid-Open Publication)).

However, with respect to the illumination apparatus set forth in Tokkai 2004-234868, there has been such a problem that, although it is possible to simplify the configuration of the driving power source, it is impossible to increase and decrease the luminance level of the light source (hereinafter, also referred to as a dimming control operation), since the purpose of Tokkai 2004-234868 is to make the illumination apparatus keep a constant brightness.

Further, with respect to the illumination apparatus set forth in Tokkai 2004-134385, since the switching member is required for every one of the plural OLED units, a large number of combinations of the OLED units and the switching members becomes necessary for smoothing the transition of the brightness changing control. Accordingly, there have been such problems that the configuration thereof becomes complicated considerably and is hardly brought into the practical use, while, when the number of combinations of the OLED units and the switching, members is made to decrease, it becomes impossible to conduct a sufficient dimming control operation.

Still further, with respect to the illumination apparatus set forth in Tokkai 2007-251036, in which the dimming control operation of the light source, constituted by a plurality of OLED devices, is achieved by conducting the controlling operation for changing the value of the DC voltage at the time of the high luminance operating mode, there have arisen such problems that a slight voltage change causes a large amount of brightness change due to the fact that the brightness versus voltage characteristic of the OLED is nonlinear, as shown in FIG. 11, resulting in the deterioration of the accuracy of the dimming control operation, and the range of the brightness differences between the plural OLEDs becomes large, due to the variations between the individual characteristics respectively corresponding to the plural OLEDs concerned.

In this connection, it has been revealed in the process of achieving the present invention through the various kinds of considerations, conducted by the present inventor, that the illumination apparatus set forth in Tokkai 2007-251036 have had such the problems that the accuracy of the dimming control operation is deteriorated at the time of the high luminance operating mode even when either the voltage value or the duty ratio of the pulse is made to selectively changed, and the range of the brightness differences becomes large, due to the variations between the individual characteristics.

SUMMARY OF THE INVENTION

To overcome the abovementioned drawbacks in conventional illumination apparatuses, it is one of objects of the present invention to provide an illumination apparatus, which makes it possible to improve the accuracy of the dimming control operation for changing the brightness of the light source that is constituted by a plurality of OLED devices, which makes it possible to reduce the range of brightness differences due to the variations between the individual characteristics, and which makes it possible not to bring a discomfort feeling to the user.

Accordingly, at least one of the objects of the present invention can be attained by any one of the illumination apparatuses, described as follows.

(1) According to an illumination apparatus reflecting an aspect of the present invention, the illumination apparatus, comprises: an OLED (Organic Light Emitting Diode) unit that is constituted by coupling a plurality of singular OLED devices to each other in serial; and a driving electric power source that drives the OLED unit in a pulse driving mode; wherein the driving electric power source comprises: a pulse generating section to generate pulses, a duty ratio of which corresponds to brightness command information for designating brightness of light to be emitted by the OLED unit; an OLED driving section to drive the OLED unit so as to make the OLED unit emit pulsed light corresponding to the pulses generated by the pulse generating section; a first voltage source to supply a first electric power to the OLED unit, only during a time when each of the pulses is an ON state; a second voltage source to supply a second electric power to the OLED unit, only during a time when each of the pulses is an OFF state; a current source to supply a third electric power to the OLED unit, only during a time when each of the pulses is an ON state; a switchover section that conducts a switchover operation between the first voltage source and the current source during a time when the duty ratio of the pulses is increasing, in such manner that the first voltage source is employed for supplying the first electric power to the OLED unit so as to make the OLED unit emit the pulsed light when the duty ratio is lower than a second threshold value, being higher than a first threshold value established in advance, while the current source is employed for supplying the third electric power to the OLED unit so as to make the OLED unit emit the pulsed light when the duty ratio becomes equal to or higher than the second threshold value, and that conducts another switchover operation between the first voltage source and the current source during a time when the duty ratio of the pulses is decreasing, in such manner that the current source is employed for supplying the third electric power to the OLED unit so as to make the OLED unit emit the pulsed light when the duty ratio is equal to or higher than the first threshold value, while the first voltage source is employed for supplying the first electric power to the OLED unit so as to make the OLED unit emit the pulsed light when the duty ratio becomes lower than the first threshold value; and an OLED illumination disabling section that makes the second voltage source supply the second electric power to the OLED unit, only during the time when each of the pulses is the OFF state, so as to disable the OLED unit to emit light.

(2) According to another aspect of the present invention, in the illumination apparatus recited in item 1, the brightness command information is such information that relates to brightness that continuously increase or continuously decrease.

(3) According to another aspect of the present invention, in the illumination apparatus recited in item 1, the first voltage source is capable of outputting such a voltage value that is sufficient for driving all of the plurality of OLED devices, coupled to each other in serial, so as to make each of the plural OLED devices emit light at a practical-use maximum brightness.

(4) According to another aspect of the present invention, in the illumination apparatus recited in item 1, the current source is capable of outputting such an electric current value that is sufficient for driving all of the plurality of OLED devices, coupled to each other in serial, so as to make each of the plural OLED devices emit light at a practical-use maximum brightness.

(5) According to another aspect of the present invention, in the illumination apparatus recited in item 1, the second voltage source is capable of outputting such a voltage value that is lower than a specific light emission threshold voltage, which is the lowest among light emission threshold voltages respectively corresponding to the plurality of OLED devices coupled to each other in serial.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENT

According to the embodiments, the present invention will be detailed in the following. However, the scope of the present invention is not limited to the embodiments concerned.

Figure 1:
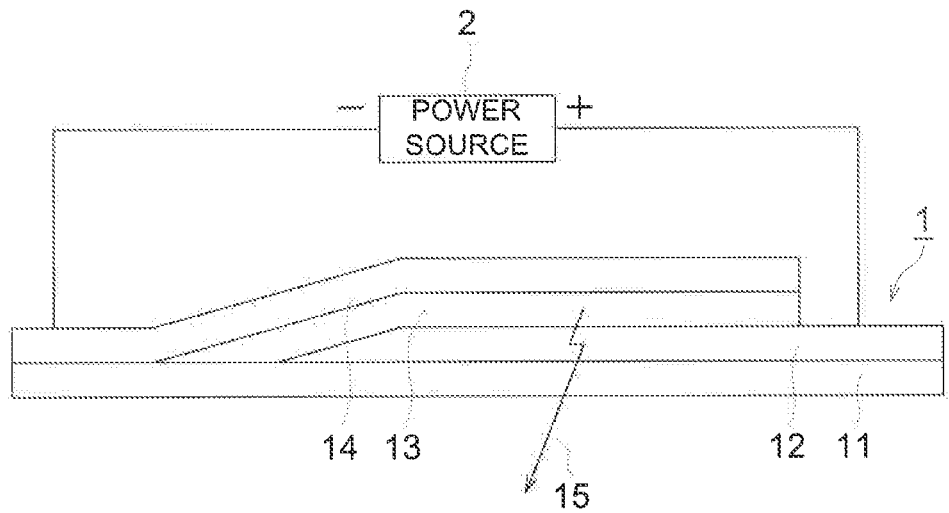
FIG. 1 shows a schematic diagram indicating a cross sectional configuration of an OLED device.

FIG. 1 shows a schematic diagram indicating a cross sectional configuration of an OLED device.

An OLED device 1 is formed by laminating a transparent electrode 12 that serves as an anode electrode, an organic layer 13 that serves as a light emitting section, and a metal film layer 14 that serves as a cathode electrode, onto a surface of a transparent substrate 11 that serves as a substrate material in the above-indicated order. A power source 2 is coupled to the transparent electrode 12 and the metal film layer 14.

The transparent substrate 11 is made of either a transparent glass plate, thickness of which is around 1 mm, or a resin material, while the transparent electrode 12 that serves as the anode electrode, is made of a conductive and transparent material, such as an ITO (indium Tin Oxide) material, an IZO (Indium Zinc Oxide) material, etc., thickness of each of which is around 100 nm, in order to make the light, generated at the organic layer 13, penetrate through both the transparent electrode 12 and the transparent substrate 11.

The thickness of the organic layer 13 is estimated at around 100 nm, so that the organic layer 13 includes a hole injection layer (40 nm), a hole transport layer (20 nm), a light emission layer (30 nm), a hole blocking layer (10 nm), an electron transport layer (30 nm), etc., which are sequentially laminated thereon by applying the vapor deposition processing.

The metal film layer 14 that serves as the cathode electrode, is made of an aluminum or silver thin film, etc., thickness of each of which is around 150 nm.

Then, by coupling the transparent electrode 12 to the anode electrode of the power source 2 and by coupling the metal film layer 14 to the cathode electrode of the power source 2, the anode electrode injects holes into the organic layer 13 through the transparent electrode 12, while the cathode electrode injects electrons into the organic layer 13 through the metal film layer 14.

In the organic layer 13 that serves as the light emission layer, recombination actions between the holes and the electrons occur. Successively, on an occasion when the excitons, which are generated by the recombination actions abovementioned, shift from the excitation state to the ground state, the light emission phenomenon occurs. Then, light 15, generated at the organic layer 13, penetrate through both the transparent electrode 12 and the transparent substrate 11, and are emitted to the outside environment.

Hereinafter, the operation for increasing and decreasing the brightness (light intensity level) of the light source (constituted by a singular OLED device or a plurality of OLED devices) is referred to as the dimming control operation.

Figure 2:
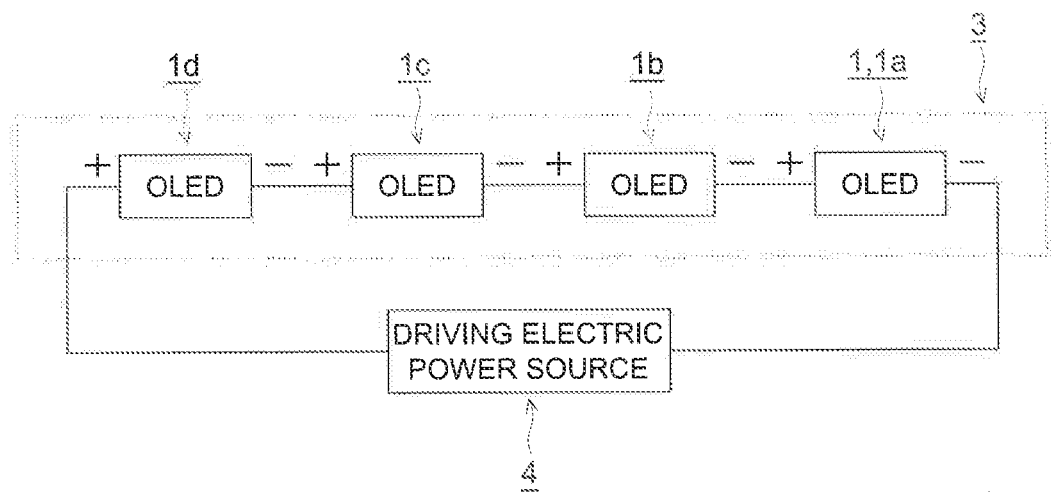
FIG. 2 shows an explanatory schematic diagram indicating an OLED unit in which a plurality of OLED devices is arranged.

FIG. 2 shows an explanatory schematic diagram indicating an OLED unit in which a plurality of OLED devices is arranged.

Hereinafter, an assembly, in which a plurality of singular OLED devices is arranged, is referred to as an OLED unit.

The illumination apparatus, embodied in the present invention, is provided with an OLED unit 3 and a driving electric power source 4.

Further, the OLED unit 3 to be employed for the illumination apparatus embodied in the present invention is configured by arranging the plurality of OLED devices 1, described in the above while referring to FIG. 1, onto the singular transparent substrate in a serial connection mode, in which a transparent electrode of a first OLED device 1a is coupled to a metal film layer of a second OLED device 1b, a transparent electrode of the second OLED device 1b is coupled to a metal film layer of a third OLED device 1c, and a transparent electrode of the third OLED device 1c is coupled to a metal film layer of a fifth OLED device 1d.

In other words, by electronically connecting the metal film layer and the transparent electrode, which are respectively belong to the adjacent OLED devices, with each other, the plurality of OLED devices are coupled to each other in the serial connection mode.

Still further, the metal film layer (cathode electrode) of the first OLED device 1a is coupled to the cathode electrode of the driving electric power source 4 and the transparent electrode (anode electrode) of the fourth OLED device 1d is coupled to the anode electrode of the driving electric power source 4, so as to make the plurality of OLED devices emit light. Then, the driving electric power source 4 drives the OLED unit 3 in a pulse driving mode, as detailed later.

Still further, each of the first OLED device 1a, the second OLED device 1b, the third OLED device 1c and the fourth OLED device 1d is formed in a plane shape, and these are arranged substantially in parallel. Each of the OLED devices has a dimension, for instance, around 15 mm×150 mm, and serves as a surface emitting device.

Yet further, generally speaking, the equivalent circuit of each of the OLED devices is represented by a register "r", a diode "d" (light emitting section) serially coupled to the register "r" and a capacitor "c" (hereinafter, also referred to as a capacitance "c") coupled to the diode "d" in parallel. Since the area of the OLED device is large, the capacitance "c" is estimated at a relatively large value, for instance, several μF (micro Farad), and the capacitance "c" of the OLED unit 3, in which, for instance, four OLED devices 1 are serially coupled to each other, is estimated at such a large value that is, for instance, about 1 μF.

In this connection, it is applicable that the plural OLED devices are serially coupled to each other by employing lead wires respectively put between them, or by making the metal film layer of the OLED device directly contact the transparent electrode of the adjacent OLED device.

It is needless to say that a large scale illumination apparatus can be formed as a practically usable apparatus by arranging the plural OLED units 3, described in the above, in the serial connection mode or the parallel connection mode, and it becoms possible to totally illuminate a room or the like, by installing the large scale illumination apparatus onto a ceiling surface or a wall surface.

FIG. 3a through FIG. 3d show explanatory graphs schematically indicating an example of a transient phenomenon when the OLED device is driven in the pulse driving mode.

In each of the graphs shown in FIG. 3a through FIG. 3d, the horizontal axis represents time "t", while the vertical axis represents voltage "Ed" (Ed'). Further, the graphs represent such a case that the OLED device is driven by the pulses, the duty ratio of each of which is set at 50%.

Figure 3A:
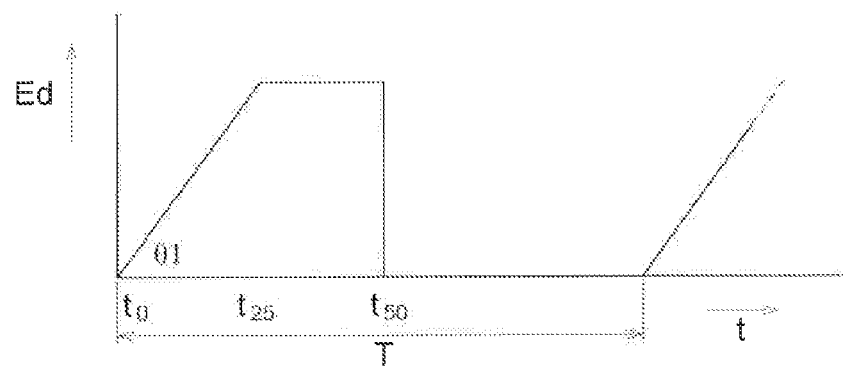
FIG. 3a, FIG. 3b, FIG. 3c and FIG. 3d show explanatory graphs schematically indicating an example of a transient phenomenon when an OLED device is driven in a pulse driving mode.
Figure 3B:
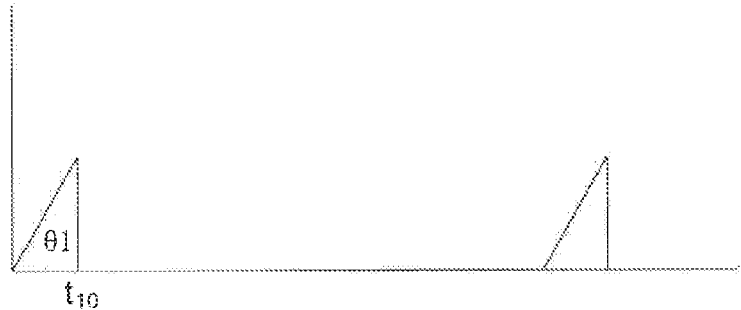
Figure 3C:
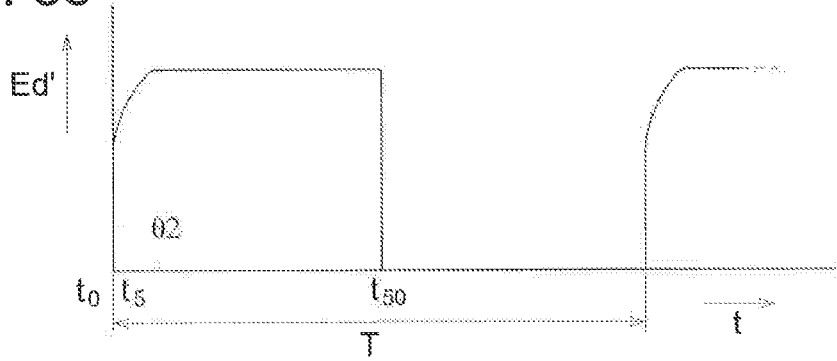
Figure 3D:
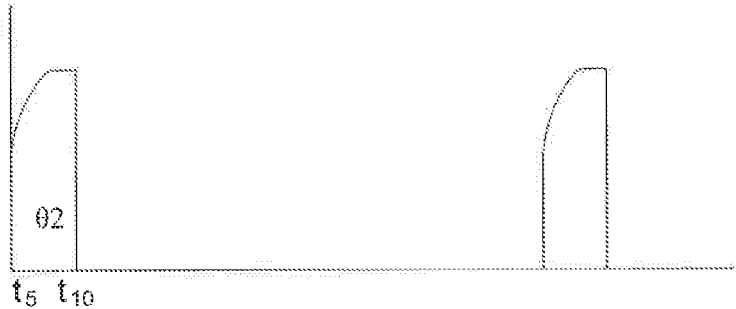

The graphs shown in FIG. 3a and FIG. 3b represent the transient phenomenon in such a case that the OLED device 1 is coupled to an electric current source (hereinafter, also referred to as a current source, for simplicity) and the OLED device is driven by electric current pulses in the pulse driving mode, while the graphs shown in FIG. 3a and FIG. 3d represent the transient phenomenon in such a case that the OLED device 1 is coupled to a voltage source and the OLED device is driven by voltage pulses in the pulse driving mode.

As shown in FIG. 3a, when the OLED device is driven by the electric current pulses, the voltage "Ed" increases gradually at inclination angle θ1, and then, reaches to the output voltage of the power source at time "$t_{25}$", which is 25% of period "T", and after that, maintains the output voltage until the voltage "Ed" is turned OFF at time "$t_{50}$", which is 50% of period "T".

Since the circuit system including the current source exhibits a relatively large time constant, which is represented by the product of its internal resistance and capacitance "c" that inherently resides in the OLED device 1, the inclination angle θ1 of the voltage "Ed" at the rising time becomes small. In other words, when the current source is employed for conducting the pulse driving operation, the rising edge of each of the pulses becomes dull.

Accordingly, for instance, as shown in FIG. 3b, when the pulse driving operation is conducted by employing the pulse that has such a duty ratio that is smaller than 25%, the voltage "Ed" cannot reach to the power source voltage, and therefore, the brightness of the illumination apparatus concerned becomes darker than the luminance level originally intended or the human sensible brightness. For instance, when the pulse driving operation is conducted by employing the pulse that has a duty ratio of around 10% (at time "$t_{10}$"), the pulse is shaped in a triangular, the brightness of the illumination apparatus concerned drastically deviates from the luminance level originally intended or the human sensible brightness.

Accordingly, the accuracy of the dimming control operation is deteriorated considerably, and it is impossible to acquire the desired brightness.

On the other hand, as shown in FIG. 3c, when the OLED device is driven by the voltage pulses, the voltage "Ed'" increases rapidly at inclination angle θ2 from time "$t_0$" when the power source is turned ON, and then, reaches to the output voltage of the power source at time "$t_5$", which is 5% of period "T", and after that, maintains the output voltage until the voltage "Ed'" is turned OFF at time "$t_{50}$", which is 50% of period "T".

Since the circuit system including the voltage source exhibits a relatively small time constant, which is represented by the product of its internal resistance and capacitance "c" that inherently resides in the OLED device 1, the inclination angle θ2 of the voltage "Ed'" at the rising time becomes large, compared to the inclination angle θ1 aforementioned. In other words, when the voltage source is employed for conducting the pulse driving operation, the rising edge of each of the pulses becomes sharp, compared to that when the current source is employed for conducing the pulse driving operation.

Accordingly, even when the pulse driving operation is conducted by employing the pulse that has a duty ratio of around 10% (at time "$t_{10}$"), as shown in FIG. 3d, the voltage "Ed'" can reach to the power source voltage, and therefore, the brightness of the illumination apparatus concerned does not become darker than the luminance level originally intended or the human sensible brightness. Further, since it becomes possible to suppress such the phenomenon that the brightness of the illumination apparatus concerned drastically deviates from the luminance level originally intended or the human sensing brightness, for instance, up as far as the duty ratio is 5% of period "T" (at time "$t_5$"), it becomes possible to improve the accuracy of the dimming control operation, and it also becomes possible to acquire the desired brightness.

Further, the lowest voltages at each of which the light emitting action of the individual OLED device is visible (hereinafter, each referred to as a light emission threshold voltage) vary among a plurality of OLED devices.

On this reason, when the plurality of OLED devices 1 is driven by either the DC voltage or the DC electric current, since the light emission start times and/or the light extinction times vary among the individual OLED devices 1, the performance grade as the illumination apparatus having the dimming control function is degraded.

In contrast to the above, when the plurality of OLED devices 1 is driven by employing such a voltage pulse whose maximum value is sufficiently larger than the light emission threshold voltage of the individual OLED device 1, it becomes possible to eliminate the variation in the light emission start times and/or the light extinction times.

Figure 11:
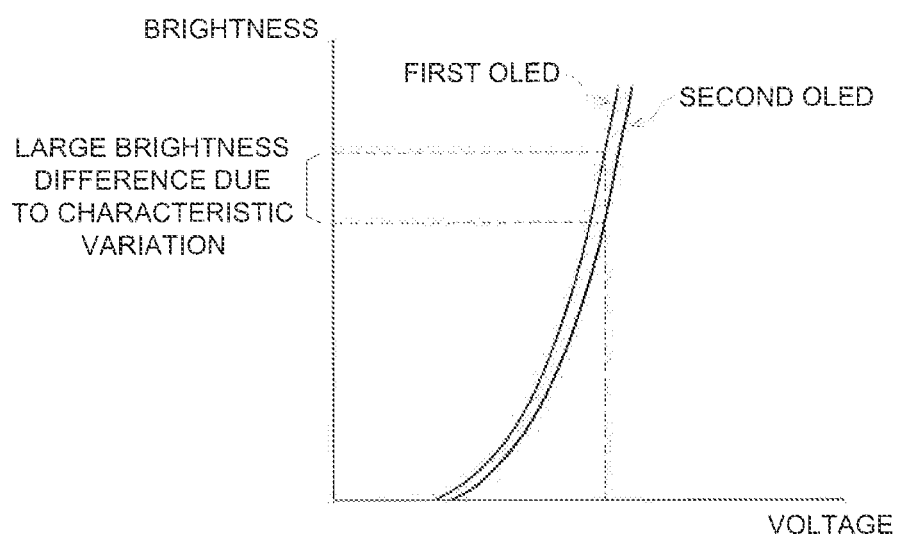
FIG. 11 shows a graph indicating relationship between an applied voltage and brightness of OLED devices.

However, as aforementioned, when the illumination apparatus concerned is driven by the voltage pulses up to the high luminance region, there would arise such problems that a slight voltage change causes a large amount of the brightness change due to the fact that the brightness versus voltage characteristic of the OLED is nonlinear, as shown in FIG. 11, resulting in the deterioration of the accuracy of the dimming control operation, and the range of the brightness differences between the plural OLEDs becomes large, due to the variations between the individual characteristics respectively corresponding to the plural OLEDs concerned. To overcome the abovementioned problems, since the brightness versus electric current characteristic is established as substantially a proportional relationship, by employing the electric current pulses for driving the OLED device, in the high luminance region, it becomes possible to reduce (narrow) the range of the brightness differences between the plural OLEDs, due to the variations between the individual characteristics respectively corresponding to the plural OLEDs concerned.

Accordingly, when the pulse driving operation is employed fix driving the OLED device, the voltage source is employed for conducting the pulse driving operation in the low luminance region (corresponding to the low duty ratio of the driving pulse), while the current source is employed for conducting the pulse driving operation in the high luminance region (corresponding to the high duty ratio of the driving pulse), so that the brightness of the light to be emitted from the illumination apparatus concerned does not drastically deviate from the objective level of the brightness, that is the duty ratio of the driving pulse, and/or the human sensible brightness.

According to the abovementioned, it becomes possible not only to improve the accuracy of the dimming control operation of the light source (illumination apparatus) constituted by the plurality of OLED devices, but also to reduce (narrow) the range of the brightness differences between the plural OLEDs, due to the variations between the individual Characteristics respectively corresponding to the plural OLEDs concerned.

Figure 4:
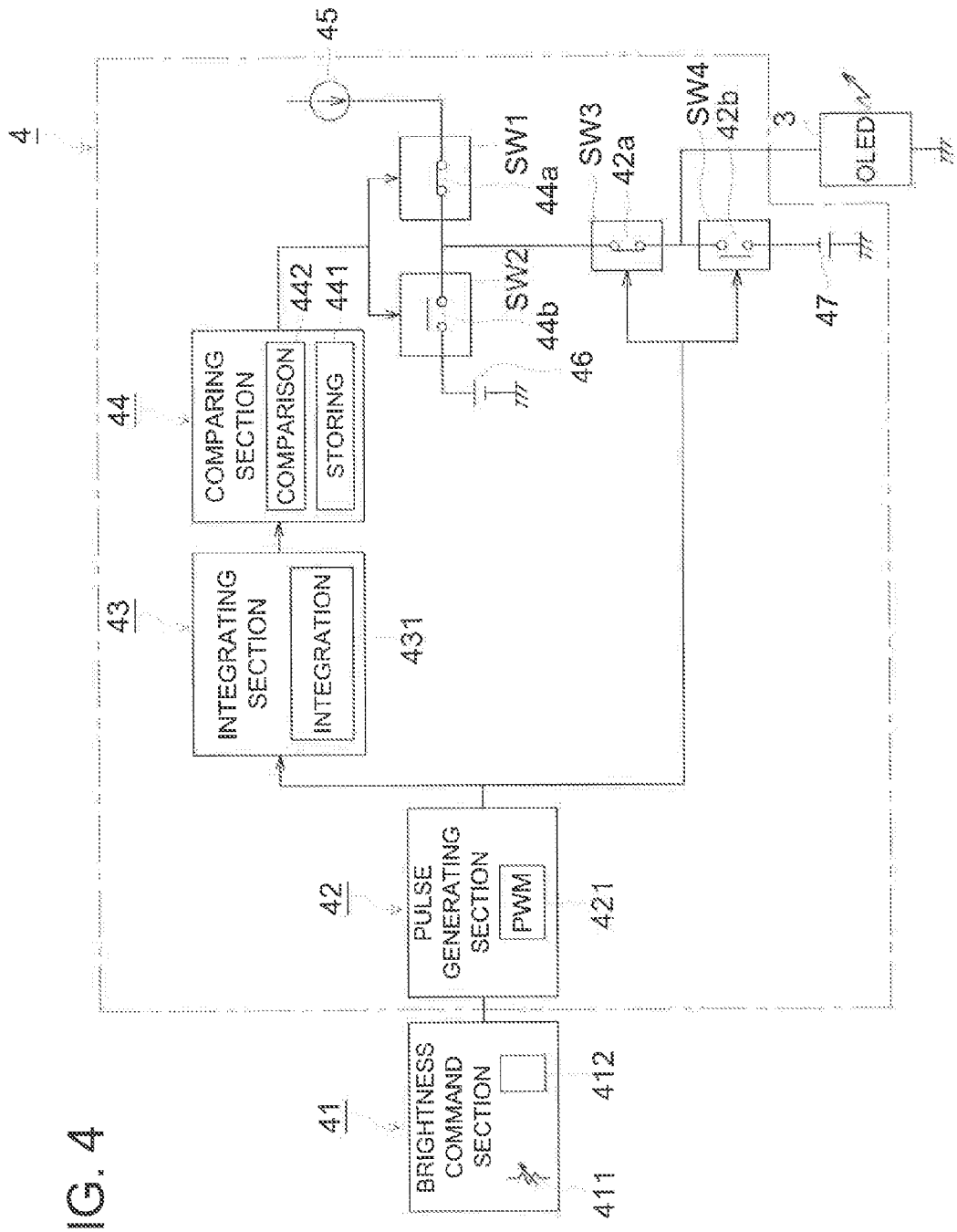
FIG. 4 shows a block diagram indicating a configuration of a driving electric power source for deriving an OLED unit.

FIG. 4 shows a block diagram indicating a configuration of the driving electric power source for deriving the OLED unit.

In the block diagram shown in FIG. 4, the arrows represent the flowing directions of the signals.

A brightness command section 41 is disposed at a position located outside the driving electric power source 4 surrounded by the alternate long and short dash lines shown in FIG. 4, and serve as such a section that commands the brightness of the OLED unit 3, so as to output a brightness command information, serving as a voltage corresponding to the brightness to be set. For instance, when the brightness is to be continuously increased or decreased as such a case that the dimming control operation is conducted by making the illumination apparatus turn ON or OFF, the brightness command section 41 continuously outputs the voltages for increasing or decreasing the brightness level.

The driving electric power source 4 (surrounded by the alternate long and short dash lines shown in FIG. 4) is provided with a pulse generating section 42 that outputs pulses, duty ratios of which are corresponding to the output voltage outputted by the brightness command section 41; an integrating section 43 that integrates the times, during each of which each of the pulses, outputted by the pulse generating section 42, is turned ON, so as to output a voltage corresponding to the integration result; a comparing section 44 that compares the output voltage, outputted by the integrating section 43, with a threshold voltage established in advance; a constant current source 45 serving as a current source that drives the OLED unit 3; a constant voltage source 46 serving as a voltage source that drives the OLED unit 3; a switch SW1 that closes a contact point 44a at the time when the output status of the comparing section 44 is ON (Hi), that is, at the time of the high luminance mode, so as to make it possible to supply the electric current, outputted by the constant current source 45, to the OLED unit 3; a switch SW2 that closes a contact point 44b at the time when the output status of the comparing section 44 is OFF (Lo), that is, at the time of the low luminance mode, so as to make it possible to supply the electric current, outputted by the constant voltage source 46, to the OLED unit 3; a switch SW3 that closes a contact point 42a at the time when the status of a output pulse $P_{PWM}$, outputted by the pulse generating section 42, is a high level "Hi", so as to make it possible to supply the acetic current, outputted by the constant current source 45 or the constant voltage source 46, to the OLED unit 3; and a switch SW4 that closes a contact point 42*b* at the time when the status of a output pulse $P_{PWM}$, outputted by the pulse generating section 42, is a low level "Lo", so as to make it possible to supply the electric current, outputted by the constant current source 45 or the constant voltage source 46, to the OLED unit 3.

Concretely speaking, a switching section (not shown in the drawings) is constituted by the switch SW1, the switch SW2 and the comparing section 44, so as to switch the driving power source between the voltage source and the current source in such a manner that the voltage sourer (constant voltage source 46) is employed for driving the OLED unit 3 to emit light during the time when the duty ratio of the pulses is currently increasing and the duty ratio is smaller than the second threshold vale that is higher than the first threshold vale, while the current source (constant current source 45) is employed for driving the OLED unit 3 to emit light at the time when the duty ratio has become equal to or greater than the second threshold vale.

Further, the switching section is so constituted that the driving power source is switched between the voltage source and the current source in such a manner that the constant current source 45 is employed for driving the OLED unit 3 to emit light, during the time when the duty ratio of the pulses is currently decreasing and is equal to or greater than the first threshold value, while the constant voltage source 46 is employed for driving the OLED unit 3 to emit light at the time when the duty ratio has become smaller than the first threshold value.

In this connection, although it can be considered that the driving power source is switched between the constant current source 45 and the constant voltage source 46 at the same threshold value in the both cases that the duty ratio of the pulses is currently increasing and decreasing, the aforementioned problem that the output voltage of the constant current source 45 decreases in the region, in which the duty ratio of the pulses is relatively small, is liable to appear considerably in the case that the duty ratio of the pulses is currently increasing, rather than in the case that the duty ratio of the pulses is currently decreasing, and therefore, the voltage decreasing problem abovementioned tends to occur up to a duty ratio higher than ever.

As abovementioned, since the voltage decreasing problem of the constant current source 45, appearing in the region in which the duty ratio of the pulses is relatively small, exhibits a hysteresis behavior with respect to the duty ratio, the driving elect is power source 4 is so constituted that, when the duty ratio of the pulses is currently increasing, the driving power source is switched at the threshold value higher than that to be employed at the time when the duty ratio of the pulses is currently decreasing.

In this connection, it is applicable that the DC electric power, which is to be supplied from a converter that converts an AC electric power supplied from a commercial AC power source to the DC electric power, is employed as either the constant current source 45 or the constant voltage source 46. Such the case as abovementioned shall be included in the scope of the present invention.

Further, the switch SW4 and a second constant voltage source 47 constitute an OLED emission disabling section. Still further, the switch SW3 serves as an OLED driving section to make the OLED unit 3 emit light in the pulse light emission mode, in response to the pulses generated in the pulse generating section 42.

Still further, it is preferable to employ such a DC voltage source, which is capable: of outputting such a voltage value that makes it possible to acquire a practically maximum brightness with respect to all of the plural OLED devices 1 constituting the OLED unit 3.

In this connection, the statuses of the switch SW1 and the switch SW2, indicated in FIG. 4, are to be set at the time when the output status of the comparing section 44 is the high level "Hi", while the statuses of the switch SW3 and the switch SW4, indicated in FIG. 4, are to be set at the time when the output status of the pulse generating section 42 is the high level "Hi".

Further, it is needless to say that a purely electric switching circuit can be applicable as any one of the switch SW1 through the switch SW4, instead of the mechanical switching device having mechanical contact points, such as the relay, etc., as indicated in the drawings.

Further, the pulse generating section 42 is coupled to the output side of the brightness command section 41, the integrating section 43 and the switch SW3 and the switch SW4 are coupled to the output side of the integrating section 43, and the switch SW1 and the switch SW2 are coupled to the output side of the comparing section 44.

Still further, the constant current source 45 is coupled to a port of the contact point 44*a* of the switch SW1, a port of the contact point 44*b* of the switch SW2 and a port of the contact point 42*a* of the switch SW3 are coupled to another port of the contact point 44*a* of the switch SW1, and the constant voltage source 46 is coupled to another port of the contact point 44*b* of the switch SW2.

Yet further, the OLED unit 3 and a port of the contact point 42*b* of the switch SW4 are coupled to another port of the contact point 42*a* of the switch SW3, and the second constant voltage source 47 is coupled to another port of the contact point 42*b* of the switch SW4.

FIG. 5*a* through FIG. 5*d* show explanatory graphs schematically indicating signal transitions respectively outputted by the various kinds of sections included in the driving electric power source 4.

Figure 5A:
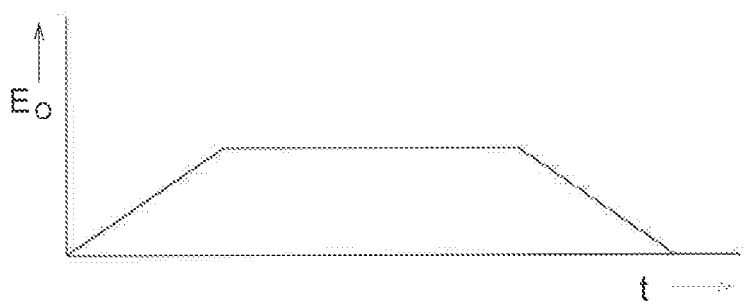
FIG. 5a, FIG. 5b, FIG. 5c and FIG. 5d show explanatory graphs schematically indicating signal transitions respectively outputted by various kinds of sections included in a driving electric power source 4.
Figure 5B:
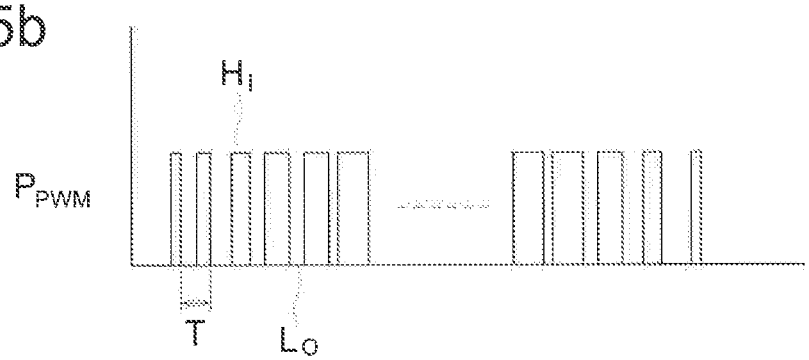
Figure 5C:
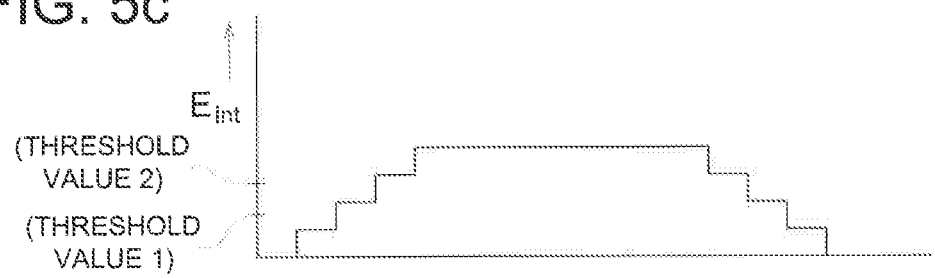
Figure 5D:
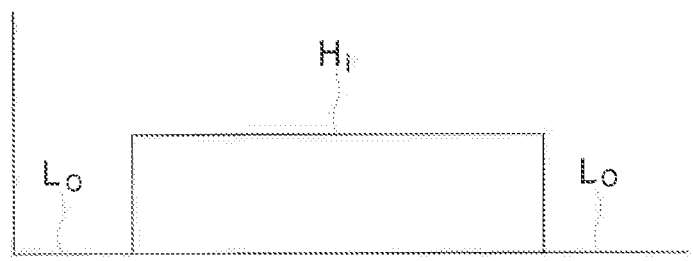

FIG. 5*a* shows a graph indicating an output voltage of the brightness command section 41, FIG. 5*b* shows another graph indicating an output voltage of the pulse generating section 42, FIG. 5*c* shows still another graph indicating an output voltage of the integrating section 43, and FIG. 5*c* shows yet another graph indicating an output voltage of the comparing section 44.

Referring to the block diagram shown in FIG. 4 and the graphs shown in FIG. 5*a* through FIG. 5*d*, each of the sections will be detailed in the following.

The brightness command section 41 is provided with: a manual brightness setting circuit 411 that allows an operator to manually control the brightness; and an automatic brightness setting circuit 412 that makes an output voltage "$E_0$" continuously increase from 0 volt to a voltage corresponding to a practical-use maximum brightness of the illumination apparatus concerned, and then, maintains the concerned voltage until the illumination apparatus is turned OFF, and snakes the output voltage "$E_0$" continuously decrease from the voltage, corresponding to the practical-use maximum brightness of the illumination apparatus concerned, to 0 volt at the time when the illumination apparatus is turned OFF, as shown in FIG. 5*a*.

In this connection, hereinafter, the practical-use maximum brightness is defined as such a maximum brightness at which the OLED devices concerned can maintain the continuous light emitting actions without generating any abnormality.

Successively, when the manual brightness setting operation is selected, the brightness command section 41 outputs an arbitral voltage that is established by using the manual brightness setting circuit 411. On the other hand, when the automatic brightness setting operation is selected, for instance, at the time when the illumination apparatus is turned ON or OFF, the automatic brightness setting circuit 412 outputs such a voltage that continuously changes linearly or curvedly in proportion to the time.

The pulse generating section 42 is provided with a PWM (Pulse Width Modulation) section 421 that applies the PWM processing to pulses generated at a predetermined frequency so as to output the output pulses $P_{PWM}$, the pulse width of which is modulated corresponding to the voltage outputted by the brightness command section 41.

Successively, the pulse generating section 42 outputs the output pulses $P_{PWM}$, the pulse width of which is modulated corresponding to the voltage outputted by the brightness command section 41, to the integrating section 43, the switch SW3 and the switch SW4. Accordingly, when the brightness command section 41 outputs such a voltage that continuously increases or decreases, the pulse generating section 42 outputs the output pulses $P_{PWM}$, the duty ratio of which continuously increases or decreases as shown in FIG. 5b.

Further, the integrating section 43 is provided with an integrator 431 that integrates the duration times of ON statuses of the output pulses $P_{PWM}$. Concretely speaking, the integrator 431 sequentially calculates (integrates) the total sum of the ON status times of the pulses, outputted per unit time by the pulse generating section 42, in the moving average manner, so as to output an output voltage $E_{int}$ (that is in proportion to the above-calculated (integrated) value.

Accordingly, when the pulses, the duty ratio of which continuously increases or decreases, are inputted into the integrating section 43 from the pulse generating section 42, the integrating section 43 outputs the output voltage $E_{int}$ that continuously keeps the high voltage level or changes step by step in a stepwise manner, as shown in FIG. 5c.

The comparing section 44 is provided with a storing section 441 to store a first threshold value 1sh and a second threshold value 2sh therein; and a comparator 442 to compare the output voltage $E_{int}$ with the first threshold value 1sh and the second threshold value 2sh.

In this connection, the first threshold value 1sh serves as such a threshold value at which the driving power source for driving the OLED unit 3 is to be switched from the constant current source 45 to the constant voltage source 46 during the time When the brightness is currently decreasing. Further, the first threshold value 1sh is established in advance at such a voltage that is derived by adding a predetermined allowance voltage to another voltage calculated by multiplying a specific output voltage of the brightness command section 41, which make it impossible for the constant current source 45 to drive the OLEO unit 3 so as to continuously change its brightness, by a constant numeral value.

On the other hand, the second threshold value 2sh is set at a voltage higher than the first threshold value 1sh, and serves as such a threshold value at which the driving power source for driving the OLED unit 3 is to be switched from the constant voltage source 46 to the constant current source 45 during the time when the brightness is currently increasing. Further, the second threshold value 2sh is established in advance at such a voltage that is derived by adding a predetermined allowance voltage to another voltage calculated by multiplying a specific output voltage of the brightness command section 41, which make it impossible for the constant current source 45 to drive the OLED unit 3 so as to continuously change its brightness, by a constant numeral value.

Successively, when the output voltage $E_{int}$ is inputted from the integrating section 43, the comparing section 44 reads out both the first threshold value 1sh and the second threshold value 2sh from the storing section 441, and makes the comparator 442 compare the output voltage $E_{int}$ with the first threshold value 1sh and the second threshold value 2sh, respectively. As a result of the comparing operations abovementioned, when the output voltage $E_{int}$ rises up to a level being equal to or higher than the second threshold value 2sh while the brightness is increasing, the output status of the comparing section 44 is turned to the high level "Hi", and when the output voltage $E_{int}$ descends down to another level being lower than the first threshold value 1sh while the brightness is decreasing, the output status of the comparing section 44 is turned to the low level "Lo".

In other words, the changeover section (not shown in the drawings) to change the driving power source that makes the OLED unit emit light is constituted by the comparing section 44, the switch SW1 and the switch SW2, so that the changeover operation between the voltage source and the current source is achieved in such a manner that, if the output voltage $E_{int}$ is smaller than the second threshold value 2sh, being higher than the first threshold value 1sh, during the time when the duty ratio is currently increasing, the OLED unit 3 is made to emit light by employing the voltage source (constant voltage source 45), while, if the output voltage $E_{int}$ is equal to or greater than the second threshold value 2sh during the time when the duty ratio is currently increasing, the OLED unit 3 is made to emit light by employing the current source (constant current source 45).

Further, the changeover operation abovementioned is achieved in such a manner that, if the output voltage $E_{int}$ is equal to or smaller than the first threshold value 1sh during the time when the duty ratio is currently decreasing, the OLED unit 3 is made to emit light by employing the constant current source 45, while, if the output voltage $E_{int}$ is smaller than the first threshold value 1sh during the time when the duty ratio is currently decreasing, the OLED unit 3 is made to emit light by employing the constant voltage source 46.

Any kind of constant current source, which is usually put in the commercial market, is available as the constant source 45. Since it has been desired that the illumination apparatus has a high brightness capability, it is preferable, more than ever, to employ such a DC power source that is capable of outputting an electric current, which is sufficient for driving all of the plural OLED devices serially coupled to the constant current source 45, so that each of the plural OLED devices acquires the practical-use maximum brightness.

In this connection, as aforementioned, the practical-use maximum brightness is defined as such a maximum brightness at which the OLED devices concerned can maintain the continuous light emitting actions without generating any abnormality.

Successively, the aforementioned electric current is always outputted to the contact point 44a of the switch SW1.

Any kind of constant voltage source, which is usually put in the commercial market, is available as the constant voltage source 46. In order to heighten the accuracy of the dimming control operation to a level higher than ever, a DC power source that is capable of outputting a voltage value, which makes it possible for all of the plural OLED devices constituting the OLED unit 3 to acquire the practical-use maximum brightness, is employed.

Successively, the aforementioned voltage is always outputted to the contact point 44b of the switch SW2.

The switch SW1 closes the contact point 44a at the time when the output status of the comparing section 44 is ON (Hi), so as to enable the constant current source 45 to supply its output current to the OLED unit 3. Further, the switch SW2 closes the contact point 44b at the time when the output status of the comparing section 44 is OFF (Lo), so as to enable the constant voltage source 46 to supply its output current to the OLED unit 3.

Accordingly, the changeover section is so constituted that, at the time when the output status of the comparing section 44 is ON (Hi), that is, when the brightness to be designated by the brightness command section 41 is high, the switch SW1 enables the constant current source 45 to drive the OLED unit 3, while, at the time when the output status of the comparing section 44 is OFF (Lo), that is, when the brightness to be designated by the brightness command section 41 is low, the switch SW2 enables the constant voltage source 46 to drive the OLED unit 3

Further, the switch SW3 closes the contact point 42a only during the time when the status of each of the output pulses $P_{PWM}$, outputted by the pulse generating section 42, is the high level "Hi", so as to enable either the constant current source 45 or the constant voltage source 46 to supply its output current to the OLED unit 3.

Still further, the switch SW4 closes the contact point 42h only during the time When the status of each of the output pulses $P_{PWM}$, outputted by the pulse generating section 42, is the low level "Lo", so as to enable the second constant voltage source 47 to supply its output current to the OLED unit 3. The second constant voltage source 47 serves as such a power source that makes the OLED unit 3 securely cease illumination thereof, detailed later.

Yet further, at the time when the status of each of the output pulses $P_{PWM}$, outputted by the pulse generating section 42, is the low level "Lo", and the contact point 42a is made to open while the contact point 42b is made to close, that is, at the time of the extinction of the OLED unit 3 illuminated by the pulse driving actions, the second constant voltage source 47 applies such a voltage that makes the OLED unit 3 securely cease illumination, to the OLED unit 3.

In this connection, it is applicable that the output voltage value of the second constant voltage source 47 is such a value that can makes the OLED unit 3 securely cease illumination, as aforementioned. Therefore, the output voltage value concerned is lower than a specific light emission threshold voltage, being the lowest one among the light emission threshold voltages respectively corresponding to the plural OLED devices serially coupled to each other.

For instance, when the lowest light emission threshold voltage is +4 volts, the output voltage value concerned is applicably set at a value in a range of +3–0 volts.

In this connection, when the output voltage value concerned is set at 0 volt, it is applicable that the illumination of the OLED unit is disabled by connecting it to the ground potential. Such the case as abovementioned shall be included in the scope of the present invention.

Further, in order to securely achieve the extinction of the OLED unit 3, it is applicable to apply an inverse bias voltage to the OLED unit 3 concerned. In this case, it is preferable that the inverse bias voltage is set at such a value that is lower than 0 volt, or more preferably in a range of 2 through −3 volts, from the viewpoint for protecting the OLED unit from the failure due to the high-voltage breakdown.

Accordingly, the driving electric power source 4 is so constituted that the output of the constant current source 45 or the constant voltage source 46 is switched by the switch SW1, so as to generate the pulses, duty ratios of which correspond to the voltage outputted by the brightness command section 41, and, at the time when the concerned pulses correspond to a low level, the voltage outputted by the second constant voltage source 47 is applied to the OLED unit by tuning ON the switch SW4, so as to securely turn OFF (achieve the extinction) the OLED unit 3 at the time of pulse driving operation.

With respect to the function to be conducted at the time of the dimming control operation in the aforementioned configuration, the operation for turning ON or OFF in the pulse driving action of the OLED unit 3 at the time when the output voltage of the brightness command section 41 is still low, that is, when the setting brightness is low, and the operation for turning ON or OFF in the pulse driving action of the OLED unit 3 at the time when the output voltage of the brightness command section 41 becomes high, that is, when the setting brightness is high, will be detailed in the following.

Figure 6:
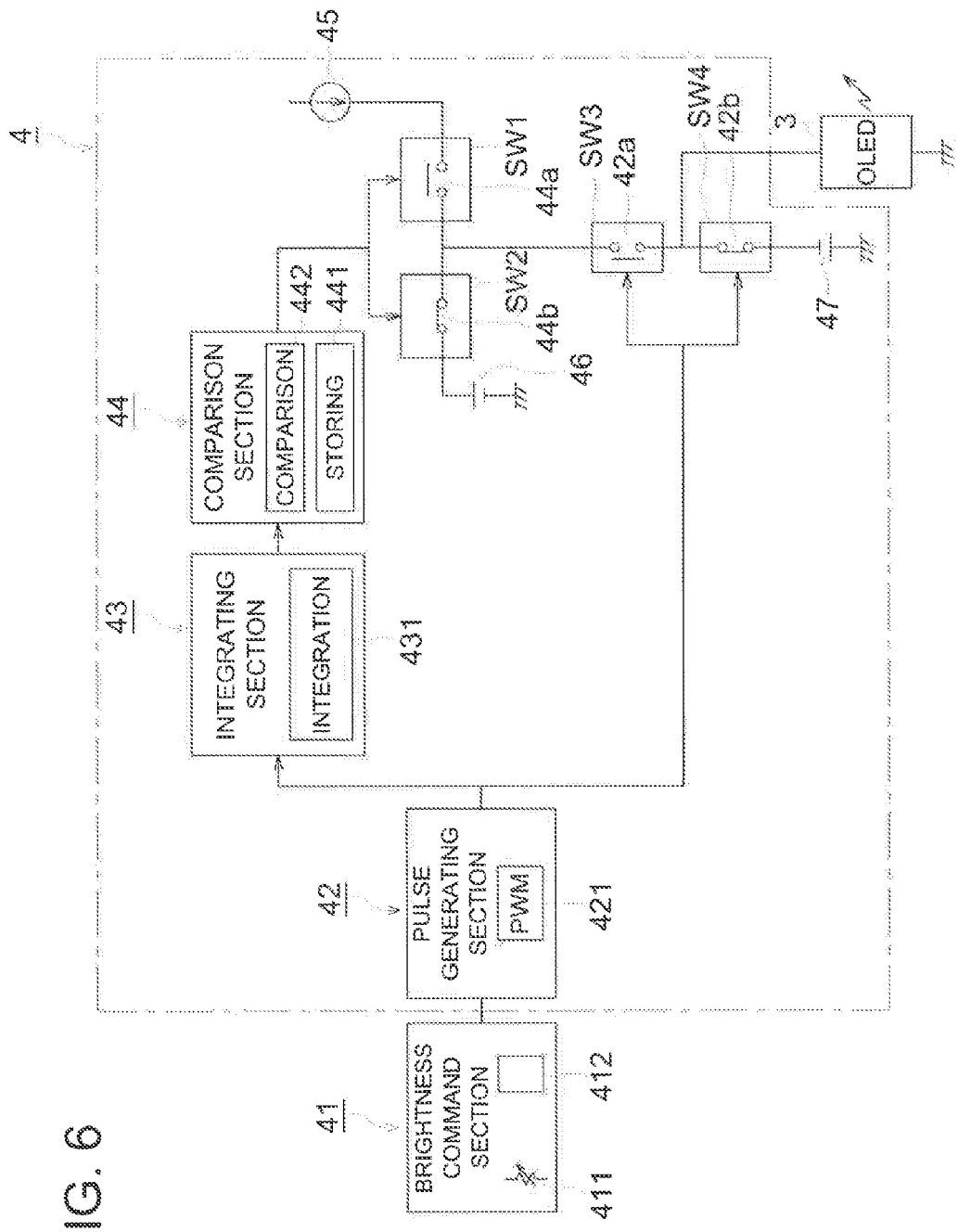
FIG. 6 shows an explanatory block diagram indicating a status of a driving electric power source at the time when an output status of a pulse generating section 42 is set at a low level "Lo", while an output voltage of a brightness command section is still low.

FIG. 6 shows an explanatory block diagram indicating a status of the driving electric power source at the time when the output status of the pulse generating section 42 is set at the low level "Lo", while the output voltage of the brightness command section 41 is still low. Further, FIG. 7a through FIG. 7d show explanatory graphs schematically indicating outputs of the concerned sections during the time when the output voltage of the brightness command section 41 is still low.

Further, FIG. 7a, FIG. 7b, FIG. 7c and FIG. 7d show the output transition, of the brightness command section 41, the other output transition of the pulse generating section 42, still the other output transition of the integrating section 43 and yet the other output transition of the comparing section 44, respectively.

Figure 7A:
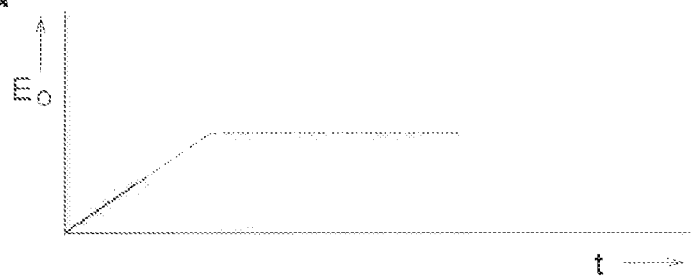
FIG. 7a, FIG. 7b, FIG. 7c, and FIG. 7d show explanatory graphs schematically indicating outputs of concerned sections during the time when an output voltage of a brightness command section is still low.
Figure 7B:

As shown in FIG. 6, FIG. 7a and FIG. 7b, since the output voltage "$E_0$" of the brightness command section 41 is still low as indicated by the solid line shown in FIG. 7a during the time when the output voltage "$E_0$" is increasing, the duty ratio of the output pulse $P_{PWM}$, outputted by the pulse generating section 42, becomes small as shown in FIG. 7b.

Figure 7C:
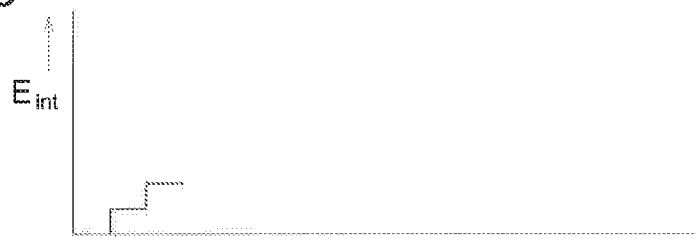

Successively, on the other hand, the output pulse $P_{PWM}$ of the pulse generating section 42 is inputted into the integrating section 43, and then, the output voltage $E_{int}$ of the integrating section 43, which is acquired by integrating the output pulse $P_{PWM}$ having the small duty ratio, becomes low as shown in FIG. 7c.

Figure 7D:

Still successively, the comparing section 44 reads out both the first threshold value 1sh and the second threshold value 2sh from the storing section 441, and, for instance, compares the output voltage $E_{int}$ of the integrating section 43, which is inputted during the time when the brightness is increasing, with the first threshold value 1sh and the second threshold value 2sh, respectively. Herein, the following explanation will be made on the premise that the output voltage $E_{int}$ of the integrating section 43, which is inputted into the comparing section 44, is low, and the output status of the comparing section 44 is the low level "Lo" since the voltage $E_{int}$ is lower than the first threshold value 1sh, as shown in FIG. 7d.

In this connection, during the time when the brightness is currently increasing, the comparing section 44 outputs the low level "Lo", if the output voltage $E_{int}$ of the integrating section 43 is low and is lower than the second threshold value 2sh. (While, the comparing section 44 outputs the high level "Hi", if the output voltage $E_{int}$ of the integrating section 43 is high and is equal to or higher than the second threshold value 2sh.)

Since the output status of the comparing section 44 is the low level "Lo", the switch SW2 is turned ON so as to make the contact point 44b close and the switch SW1 is turned OFF so as to make the contact point 44a open, and as a result, the constant voltage source 46 is enabled to supply the electric power to the OLED unit 3.

Further, on the other hand, the output pulse $P_{PWM}$ of the pulse generating section 42 is inputted into both the switch SW3 and the switch SW4. Herein, the following explanation will be made on the premise that during the time when the output pulse $P_{PWM}$, currently inputted, is the low level "Lo", the switch SW4 is turned ON, while the switch SW3 is turned OFF.

In this connection, during the time when the output pulse $P_{PWM}$ is set at the high level "Hi" the switch SW3 is turned ON (the switch SW4 is turned OFF), while, during the time when the output pulse $P_{PWM}$ is set at the low level "Lu", the switch SW4 is turned ON (the switch SW3 is turned OFF).

Since the switch SW3 is turned OFF, the electric power to be supplied from the constant voltage source 46 is shut down, and since the switch SW4 is turned ON, the aforementioned voltage to be supplied from the second constant voltage source 47 is applied to the OLED unit 3 so as to make the OLED unit 3 securely cease illumination.

Figure 8:
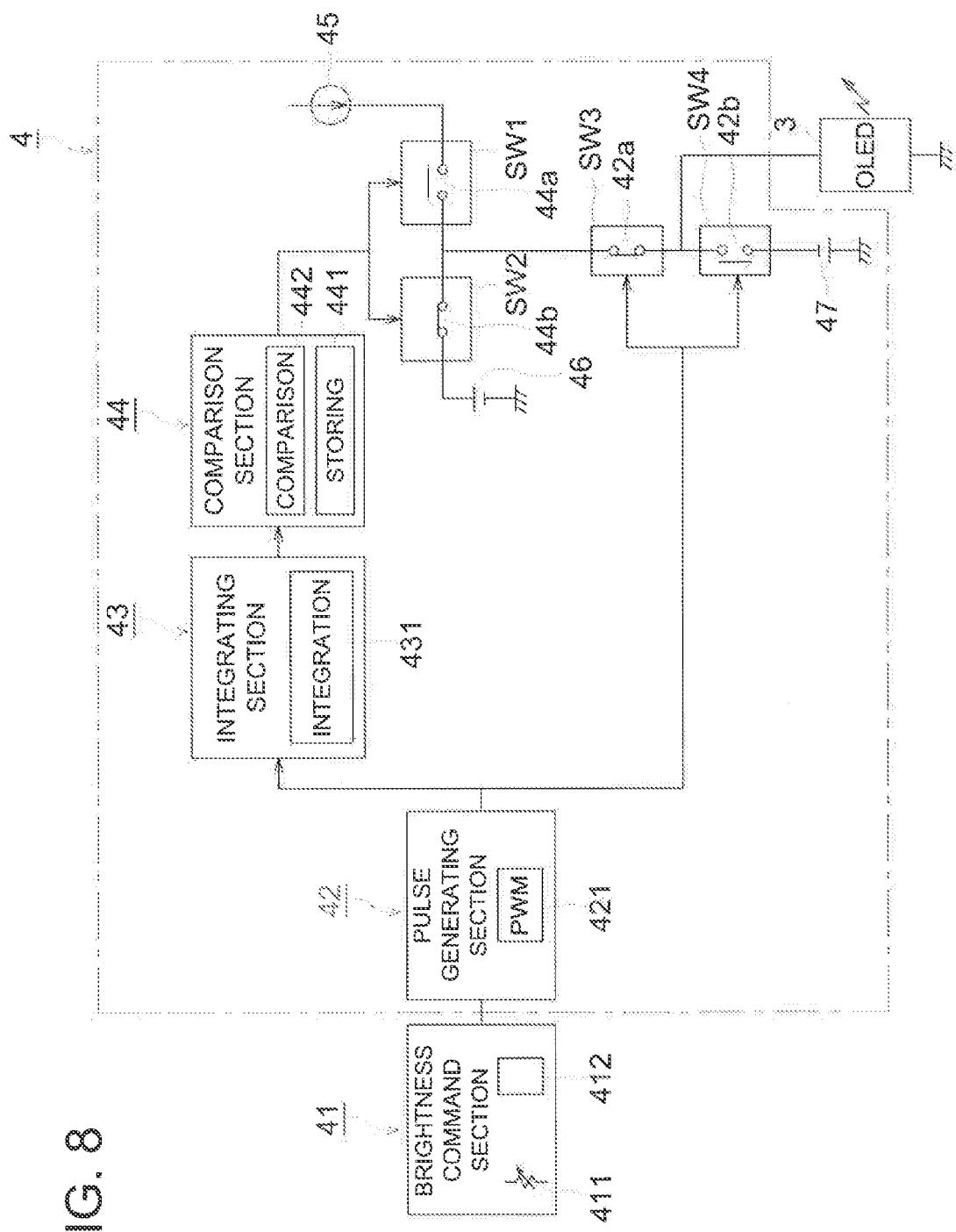
FIG. 8 shows an explanatory block diagram indicating a status of a driving electric power source at the time when an output status of a pulse generating section is set at a high level "Hi", while an output voltage of a brightness command section is still low.

FIG. 8 shows an explanatory block diagram indicating a status of the driving electric power source at the time When the output status of the pulse generating section 42 is set at the high level "Hi", while the output voltage of the brightness command section 41 is still low.

As shown in FIG. 8, FIG. 7a and FIG. 7b, since the output voltage "$E_0$" of the brightness command section 41 is still low as indicated by the solid line shown in FIG. 7a, the duty ratio of the output pulse $P_{PWM}$, outputted by the pulse generating section 42, becomes small as shown in FIG. 7b.

Since the functions of the pulse generating section 42, the integrating section 43, the comparing section 44 the switch SW1 and the switch SW2 are the same as those described by referring to FIG. 6, the explanations for them will be omitted in the following.

As a result, the switch SW2 is turned ON so as to make the contact point 44b close and the switch SW1 is turned OFF so as to make the contact point 44a open, and accordingly, the constant voltage source 46 is enabled to supply the electric power to the OLED unit 3.

Successively, the output pulse $P_{PWM}$ of the pulse generating section 42 is inputted into both the switch SW3 and the switch SW4. Herein, the following explanation will be made on the premise that, during the time when the output pulse $P_{PWM}$, currently inputted, is the high level "Hi", the switch SW3 is turned ON, while the switch SW4 is turned OFF.

Since the switch SW4 is turned OFF, the electric power to be supplied from the second constant voltage source 47 is shut down, and since the switch SW3 is turned ON, the constant voltage source 46 supplies the electric power to the OLED unit 3 so as to make the OLED unit 3 securely emit light.

As described in the foregoing while referring to FIG. 6 through FIG. 8, during the time when the output voltage of the brightness command section 41 is still low, that is, when the brightness is set at a low level, the OLED unit 3 is driven by the pulses, having a low duty ratio and supplied from the voltage power source, in the pulse driving mode, and, at the time when the pulse is turned ON state, the constant voltage source 46 can make the OLED unit 3 securely emit light, while at the time when the pulse is turned OFF state, the second constant voltage source 47 can make the OLED unit 3 securely cease illumination.

Figure 9:
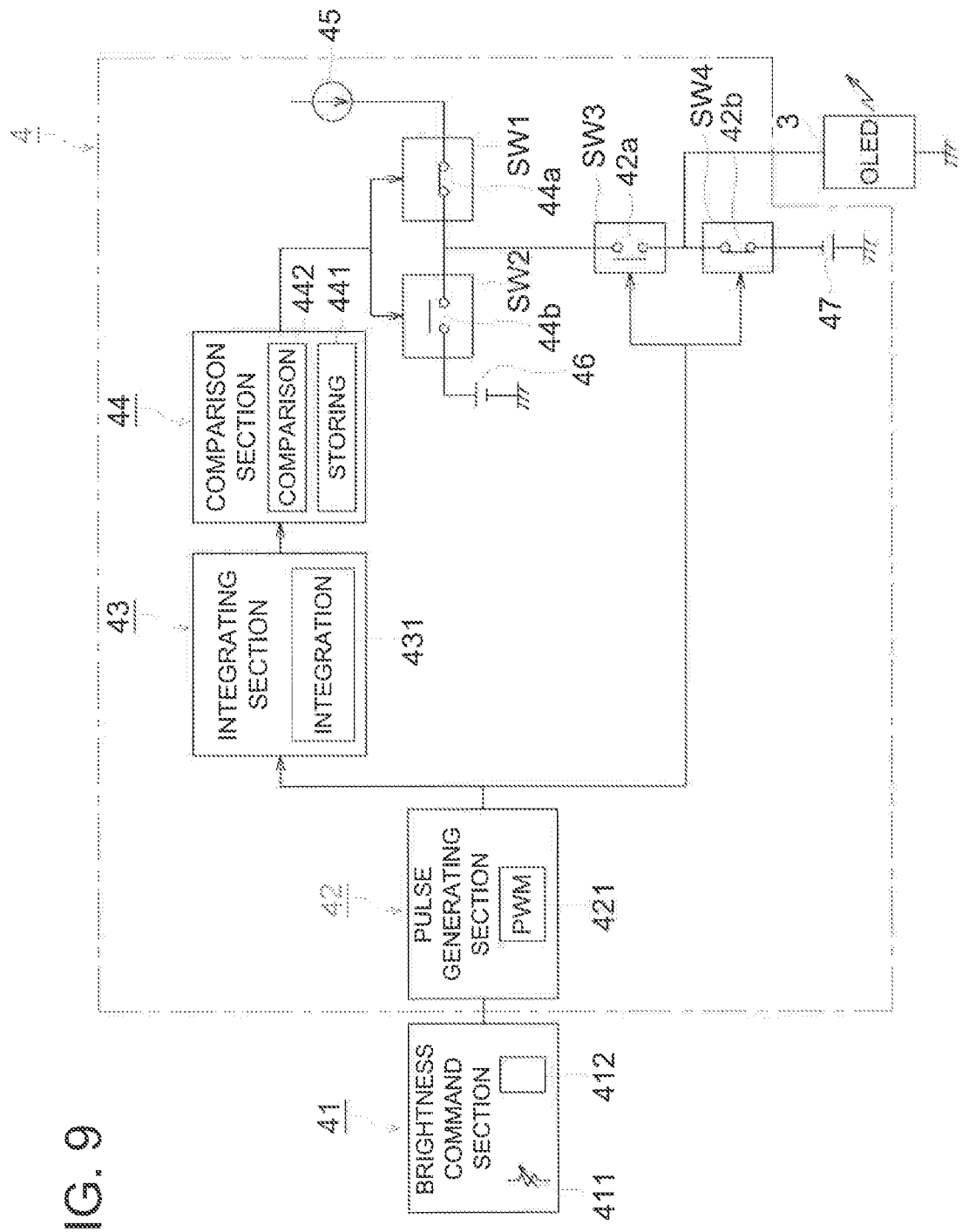
FIG. 9 shows an explanatory block diagram indicating a status of a driving electric power source at the time when an output status of a pulse generating section is set at a low level "Lo", while an output voltage of a brightness command section becomes high.

FIG. 9 shows an explanatory block diagram indicating a status of the driving electric power source at the time when the output status of the pulse generating section 42 is set at the low level "Lo", while the output voltage of the brightness command section 41 becomes high. Further, FIG. 10a through FIG. 10d show explanatory graphs schematically indicating outputs of the concerned sections during the time when the output voltage of the brightness command section 41 becomes high.

Further, FIG. 10a, FIG. 10b, FIG. 10c and FIG. 10d show the output transition of the brightness command section 41, the other output transition of the pulse generating section 42, still the other output transition of the integrating section 43 and yet the other output transition of the comparing section 44, respectively.

Figure 10A:
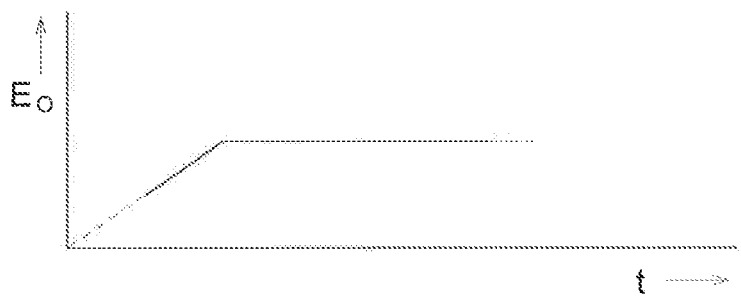
FIG. 10a, FIG. 10b, FIG. 10c and FIG. 10d show explanatory graphs schematically indicating outputs of concerned sections during the time when an output voltage of a brightness command section becomes high.
Figure 10B:
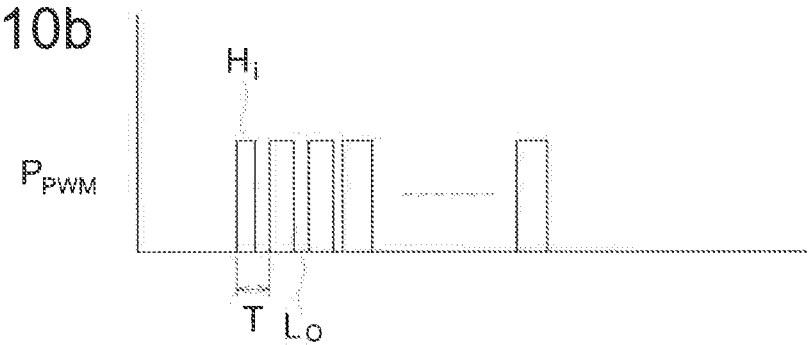

As shown in FIG. 6, FIG. 7a and FIG. 7b, since the output voltage "$E_0$" of the brightness command section 41 becomes high (solid line) as indicated by the solid line shown in FIG. 10a during the time when the output voltage "$E_0$" is increasing, the duty ratio of the output pulse $P_{PWM}$, outputted by the pulse generating section 42, becomes large as shown in FIG. 10b.

Figure 10C:
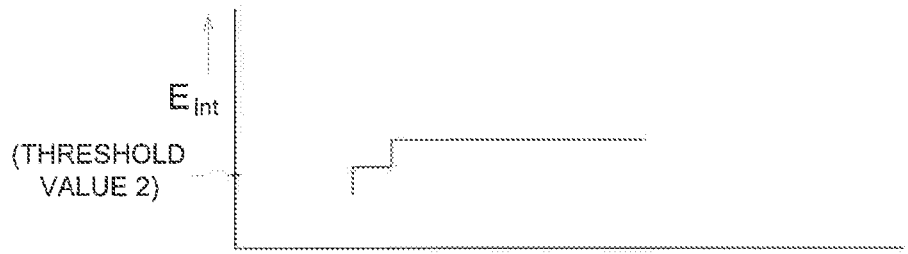

Successively, on the other hand, the output pulse $P_{PWM}$ of the pulse generating section 42 is inputted into the integrating section 43, and then, the output voltage $E_{int}$ of the integrating section 43, winch is acquired by integrating the output pulse $P_{PWM}$ having the large duty ratio, becomes high as shown in FIG. 10c.

Figure 10D:
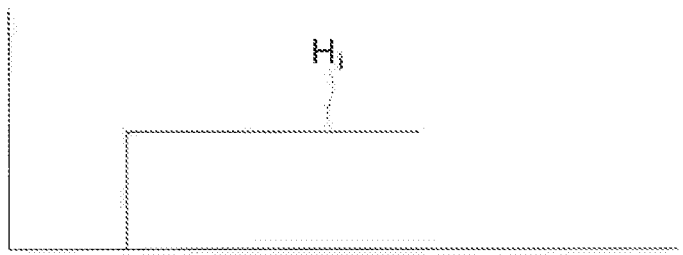

Still successively, the comparing section 44 reads out both the first threshold value 1sh and the second threshold value 2sh from the storing section 441, and, for instance, compares the output voltage $E_{int}$ of the integrating section 43, which is inputted during the time when the brightness is increasing, with the first threshold value 1sh and the second threshold value 2sh, respectively. Herein, the following explanation will be made on the premise that the output voltage $E_{int}$ of the integrating section 43, which is inputted into the comparing section 44, is high, and the output status of the comparing section 44 is the high level "Hi" since the voltage $E_{int}$ is equal to or higher than the second threshold value 2sh, as shown in FIG. 10d.

In this connection, during the time when the brightness is currently increasing, the comparing section 44 outputs the high level "Hi", if the output voltage $E_{int}$ of the integrating section 43 is high and is equal to or higher than the second threshold value 2sh. (While, the comparing section 44 outputs the low level "Lo", if the output voltage $E_{int}$ of the integrating section 43 is low and is lower than the second threshold value 2sh.)

Since the output status of the comparing section 44 is the high level "Hi", the switch SW2 is turned OFF so as to make the contact point 44b open and the switch SW1 is turned ON so as to make the contact point 44a close, and as a result, the constant current source 45 is enabled to supply the electric power to the OLED unit 3.

Further, on the other hand, the output pulse $P_{PWM}$ of the pulse generating section 42 is inputted into both the switch SW3 and the switch SW4. Since the functions of the switch SW3, the switch SW4 and the second constant voltage source 47 are the same as those described by referring to FIG. 6, the explanations for them will be omitted in the following.

As a result, since the switch SW3 is turned OFF, the electric power to be supplied from the constant current source 45 is shut down, and since the switch SW4 is turned ON, the second constant voltage source 47 applies the aforementioned voltage to the OLED unit 3 so as to make the OLED unit 3 securely cease illumination.

Among FIG. 4, FIG. 10a through FIG. 10d, FIG. 4 shows a block diagram indicating such a state that the output status of the pulse generating section 42 is set at the high level "Hi" when the output voltage of the brightness command section 41 becomes high.

Since the output voltage "$E_0$" of the brightness command section 41 increases and becomes high (solid line) as indicated by the solid line shown in FIG. 10a, the duty ratio of the output pulse P_{PWM}, outputted by the pulse generating section 42, becomes large as shown in FIG. 10b.

Since the functions of the pulse generating section 42, the integrating section 43, the comparing section 44, the switch SW1 and the switch SW2 are the same as those described by referring to FIG. 9, the explanations for them will be omitted in the following.

As a result, the switch SW2 is turned OFF so as to make the contact point 44b open, and the switch SW1 is turned ON so as to make the 44a close, and accordingly, the constant current source 45 is enabled to supply the electric power thereof to the OLED unit 3.

Further, the output pulse P_{PWM} of the pulse generating section 42 is inputted into both the switch SW3 and the switch SW4. Since the functions of the switch SW3, the switch SW4 and the second constant voltage source 47 are the same as those described by referring to FIG. 8, the explanations for them will be omitted in the following.

As a result, during the time when the status of the output pulse P_{PWM}, inputted into the switch SW3 and the switch SW4, is kept at the high level "Hi", the switch SW3 is turned ON so as to make the contact point 42a close and the switch SW4 is turned OFF so as to make the contact point 42b open, and accordingly, the constant current source 45 supplies the electric power to the OLED unit 3.

As described in the foregoing while referring to FIG. 4 and FIG. 11, at the time when the output voltage of the brightness command section 41 becomes high, that is, when the brightness is set at a high level, the OLED unit 3 is driven by the pulses, having a high duty ratio and supplied from the current power source, in the pulse driving mode, and, at the time when the pulse is turned ON state, the constant current source 45 can make the OLED unit 3 securely emit light, while at the time when the pulse is turned OFF state, the second constant voltage source 47 can make the OLED unit 3 securely cease illumination.

Further, in the abovementioned embodiment, the integrating section 43 is not indispensable for the configuration concerned, but it is also applicable that the system is so constituted that the switchover between the constant voltage source 46 and the constant current source 45 is achieved by comparing the duty ratio of the output pulse P_{PWM}, which is directly inputted from the pulse generating section 42 into the comparing section 44, with the first threshold value or the second threshold value.

Still further, instead of the aforementioned configuration exemplified as the embodiment of the present invention, in which the dimming control operation is achieved by continuously increasing or continuously decreasing the brightness, it is also applicable that the concerned system is so constituted that the duty ratio of the driving pulses is established by operating the manual brightness controlling mechanism, which allows the operator to adjust the brightness at a desired value by using a dial or the like, and the duty ratio above-established is compared with the second threshold value when the dimming control operation is conducted for increasing the brightness, while the duty ratio above-established is compared with the first threshold value when the dimming control operation is conducted for decreasing the brightness, so that the dimming control operation is achieved by switching the constant current source 45 and the constant voltage source 46 to each other corresponding to the result of the comparing operation above-conducted.

According to the present invention described in the foregoing, it becomes possible to improve the accuracy of the dimming control operation in regard to the brightness of the light source that is constituted by a plurality of OLED devices, and accordingly, it becomes possible to provide an illumination apparatus that does not bring a discomfort feeling to the user.

While the preferred embodiments of the present invention have been described using specific term, such description is for illustrative purpose only, and it is to be understood that changes and variations may be made without departing from the spirit and scope of the appended claims.

The invention claimed is:
1. An illumination apparatus, comprising:
an OLED (Organic Light Emitting Diode) unit that is constituted by coupling a plurality of singular OLED devices to each other in serial; and
a driving electric power source that drives the OLED unit in a pulse driving mode;
wherein the driving electric power source comprises:
a pulse generating section to generate pulses, a duty ratio of which corresponds to brightness command information for designating a brightness of light to be emitted by the OLED unit;
an OLED driving section to drive the OLED unit to make the OLED unit emit pulsed light corresponding to the pulses generated by the pulse generating section;
a voltage source to supply a first electric power to the OLED unit, only during a time when each of the pulses is an ON state;
a voltage source to supply a second electric power to the OLED unit, only during a time when each of the pulses is an OFF state;
a current source to supply a third electric power to the OLED unit, only during a time when each of the pulses is an ON state;
a switchover section that conducts a switchover operation between the voltage source and the current source during a time when the duty ratio of the pulses is increasing, in a manner that the voltage source is employed for supplying the first electric power to the OLED unit to make the OLED unit emit the pulsed light when the duty ratio is lower than a second threshold value, being higher than a first threshold value established in advance, while the current source is employed for supplying the third electric power to the OLED unit to make the OLED unit emit the pulsed light when the duty ratio becomes equal to or higher than the second threshold value, and that conducts another switchover operation between the voltage source and the current source during a time when the duty ratio of the pulses is decreasing, in a manner that the current source is employed for supplying the third electric power to the OLED unit to make the OLED unit emit the pulsed light when the duty ratio is equal to or higher than the first threshold value, while the voltage source is employed for supplying the first electric power to the OLED unit to make the OLED unit emit the pulsed light when the duty ratio becomes lower than the first threshold value; and
an OLED illumination disabling section that makes the voltage source supply the second electric power to the OLED unit, only during the time when each of the pulses is the OFF state, to disable the OLED unit to emit light.
2. The illumination apparatus of claim 1,
wherein the brightness command information is information that relates to brightness that continuously increase or continuously decrease.

3. The illumination apparatus of claim 1,
wherein the first voltage source is capable of outputting a voltage value that is sufficient for driving all of the plurality of OLED devices, coupled to each other in serial, to make each of the plural OLED devices emit light, at a practical-use maximum brightness.

4. The illumination apparatus of claim 1,
wherein the current source is capable of outputting an electric current value that is sufficient for driving all of the plurality of OLED devices, coupled to each other in serial, to make each of the plural OLED devices emit light at a practical-use maximum brightness.

5. The illumination apparatus of claim 1,
wherein the second voltage source is capable of outputting a voltage value, wherein the voltage value is lower than a specific light emission threshold voltage, which is lower than light emission threshold voltages corresponding to the plurality of OLED devices coupled to each other in serial.

* * * * *